United States Patent [19]

Shimazaki et al.

[11] Patent Number: 5,095,392

[45] Date of Patent: * Mar. 10, 1992

[54] DIGITAL SIGNAL MAGNETIC RECORDING/REPRODUCING APPARATUS USING MULTI-LEVEL QAM MODULATION AND MAXIMUM LIKELIHOOD DECODING

[75] Inventors: Hiroaki Shimazaki, Moriguchi; Toyohiko Matsuta; Masafumi Shimotashiro, both of Neyagawa; Masaaki Kobayashi, Kawanishi, all of Japan

[73] Assignee: Matsushita Electric Industrial Co., Ltd., Osaka, Japan

[*] Notice: The portion of the term of this patent subsequent to Dec. 18, 2007 has been disclaimed.

[21] Appl. No.: 302,325

[22] Filed: Jan. 27, 1989

[30] Foreign Application Priority Data

Jan. 27, 1988 [JP] Japan .................................. 63-16061
Feb. 19, 1988 [JP] Japan .................................. 63-38172

[51] Int. Cl.$^5$ .......................... G11B 5/09; G11B 5/00
[52] U.S. Cl. ........................................ 360/40; 360/32
[58] Field of Search ...................... 360/40, 32, 48, 29, 360/66; 375/39

[56] References Cited

U.S. PATENT DOCUMENTS

| | | |
|---|---|---|
| 4,077,021 | 2/1978 | Csajka et al. |
| 4,433,349 | 2/1984 | Kimura .................................. 360/66 |
| 4,709,377 | 11/1987 | Martinez et al. ...................... 375/39 |
| 4,755,998 | 7/1988 | Gallager .............................. 375/39 |
| 4,864,421 | 9/1989 | Morioka et al. ..................... 358/334 |
| 4,882,638 | 11/1989 | Onishi et al. ......................... 360/32 |
| 4,979,052 | 12/1990 | Matsuta et al. ....................... 360/40 |

OTHER PUBLICATIONS

Channel Coding with Multilevel/Phase Signals, vol. IT-28, 1/1/82, by: Gottfried Ungerboeck, Member, IEEE.
Video Disc Study Group to be Activated by SMPTE, vol. 86, 10/77.
Signal System Design for a Digital Video Recording System, vol. 86, 10/77, by: Luigi Gallo.
Digital Video Recording: New Results in Channel Coding and Error Protection, by Jurgen K. R. Heitmann, 2/84.
An Analytical Approach to the Standardization of Digital Videotape Recorders, by: Jurgen K. R. Heitmann, 3/82.
An Experimental Digital Video Recording System, by Philips Research Laboratories Eindhoven, 8/86.
An Experimental Digital VTR Capable of 12-Hour Recording, by: C. Yamaitsu, A. Ide, T. Juri, 8/87.
An Overview of Recent Technology of Digital Video Recording by Hotaka Minaguchi and Tatsuo Nomura (NHK Science and Technical Research Laboratories, Tokyo (1987).

Primary Examiner—Aristotelis Psitos
Assistant Examiner—Varsha V. Sheladir
Attorney, Agent, or Firm—Wenderoth, Lind & Ponack

[57] ABSTRACT

A digital signal magnetic recording/reproducing apparatus converts a digital signal into multi-value digital signals and performs recording/reproducing of a multi-value quadrature amplitude-modulated signal. By using the multi-value quadrature amplitude modulation, it is possible to remove the DC component in the recording signal and improve the utilization efficiency of the recording frequency band. Further, using a system to memorize the frequency characteristic of the magnetic recording/reproducing unit and effect Viterbi decoding regarding the intersymbol interference caused by the frequency as a convolutional coding, it is possible to detect the level without necessitating frequency equalization. Accordingly, there arises no deterioration of the S/N ratio by frequency equalization. Furthermore, by providing an encoder for error control coding by increasing the number of multi-values and a corresponding decoder, the error rate can be improved against the deterioration of the S/N ratio. Further, by bias recording the multi-value quadrature amplitude modulated signal, non-linearity of the electromagnetic conversion system is relaxed, and deterioration of the S/N ratio by distortion is improved.

16 Claims, 15 Drawing Sheets

8 AMPM
($l = 2^2 \cdot n_3 + 2 \cdot n_2 + n_1$)

16 QAM
($l = 2^3 \cdot m_3 + 2^2 \cdot m_2 + 2 \cdot m_1 + m_0$)

$C_0$ (0, 4, 8, 12)
$C_1$ (1, 5, 9, 13)
$C_2$ (2, 6, 10, 14)
$C_3$ (3, 7, 11, 15)

DIGITAL SIGNAL MAGNETIC RECORDING/REPRODUCING APPARATUS USING MULTI-LEVEL QAM MODULATION AND MAXIMUM LIKELIHOOD DECODING

BACKGROUND OF THE INVENTION

1. Field of the Invention

The present invention relates to a digital signal magnetic recording/reproducing apparatus such as a digital video tape recorder (DVTR).

2. Description of the Prior Art

In conventional digital signal magnetic recording/reproducing apparatuses, due to the difficulty of recording/reproducing the direct current component, there have been used base band modulations having reduced direct current component in the recording signals, such as NRZ codes (e.g., J. K. R. Heitmann "An Anaitical Approach to the Standardization of Digital Video Tape Recorder", SMPTE J., 91,3, Mar. 1982, or J. K. R. Heitmann "Digital Video Recording, New Result in Channel Coding and Error Protection", SMPTE J., 93:140-144, Feb. 1984), 8-10 block codes (e.g. J. L. E. Baldwin "Digital Television Recording with Low Tape Consumption", SMPTE J., 88:490-492, July, 1979), Miller-square ($M^2$) codes e.g., L. Gallo "Signal System Design for a Digital Video Recording System", SMPTE J. 86:749-756, Oct. 1977), ternary partial response system, etc.

However, in the digital signal magnetic recording/reproducing apparatuses utilizing such base band modulations, due to the basic system of recording the binary signals, utilization efficiency of the recording frequency band (transmissible bit rate per unit band) is low. For instance, assuming the roll-off rate of the nyquist transmission system (i.e. a transmission system having a role off spectrum free from intersymbol interference) to be 0.5, the utilization efficiency of the frequency band is at most 1.33 bits/sec./Hz. This incurs an increased tape consumption, making difficult long time recording. Further, in order to increase the recording rate, there can be considered a method of expanding the recording frequency band, a method of increasing the number of recording channels, or a method of increasing the relative velocity However, if the recording frequency band is expanded, the S/N ratio is substantially deteriorated. Accordingly, the recording rate cannot be increased to any great extent. When the number of recording channels is increased, the track width is narrowed and the S/N ratio is deteriorated. If the relative velocity is increased, the amount of tape consumption naturally comes into question.

As for the deterioration of the S/N ratio, the error rate may be improved by using the error control coding. However, the bit rate of the data which can be actually recorded is lost by such coding (Ref. L. M. H. E. Dreissen et al., "An Experimental Digital Video Recording System", IEEE Conf. Jun. 1986, or C. Yamamitsu et al., "An Experimental Digital VTR Capable of 12-hour Recording", IEEE Trans. on CE,CE-33, No.3, pp 240-248, 1987).

Further, there has been proposed a method of preventing the deterioration of the S/N ratio by frequency equalization in such manner that, during the detection of the reproduction signal, Viterbi decoding is performed by regarding the intersymbol interference as a convolutional coding. In this method, however, in the recording/reproducing of the binary pulse sequences, an improvement is realized only in the detection capacity, and the utilization efficiency of the frequency band still remains low (cf. K. Matsushita et al "path Feedback Viterbi Detection without Opening Eye", IEICE (the Institute of Electronics, Information and Communication Engineers of Japan) Report, MR87-38, Vol.87, No.265, pp. 21-27, 1988).

On the other hand, there has been proposed a coded modulation scheme carried out by combining a multi-value modulation scheme, which shows a high utilization efficiency of the frequency band, with an error control coding for application to the digital data transmission. This, however, does not give consideration to the special conditions such as the effect of non-linear distortion or the effect of saturation characteristic in the case of making recording/reproducing on a magnetic recording medium (cf. G. Ungerboeck "Channel Coding with Multilevel/phase Signals", IEEE Trans. on IT, IT-28, No. 1, pp. 55-67, 1982).

We have already proposed a new digital signal magnetic recording/reproducing apparatus having a high utilization efficiency of the frequency band and high recording rate in U.S. patent application Ser. No. 07/251,094 (filed on Sept. 29, 1988). In this apparatus, however, no consideration is given to the improvement of the error rate of the reproduced signal.

SUMMARY OF THE INVENTION

It is an object of the present invention to provide a new digital magnetic recording/reproducing apparatus having a higher utilization efficiency of the frequency band, a higher recording rate, and an improved error rate of the reproduced signals than the conventional digital magnetic recording/reproducing apparatuses.

In order to attain the above object, a digital magnetic recording/reproducing apparatus of this invention comprises: an encoder for coding an inputted digital signal into a multi-value digital signal; carrier generator for generating a carrier; a multi-value quadrature amplitude modulator for subjecting an output of the encoder to quadrature biphase modulation using the carrier generated by the carrier generator (hereinafter to be simply referred to as modulator); a magnetic recording/reproducing unit for recording an output of the modulator on a magnetic recording medium and reproducing the recorded signal; a carrier reproducing unit for reproducing the carrier from the reproduced signal from the magnetic recording/reproducing unit; a demodulator for demodulating the reproduced signal from the magnetic recording/reproducing unit by using the carrier reproduced by the carrier reproducing unit; and a maximum likelihood decoder (e.g., a Viterbi decoder) for decoding an output of the demodulator into a digital signal by regarding an intersymbol interference generated by the frequency characteristic of the magnetic recording/reproducing unit as a convolutional coding.

The apparatus may be provided with an encoder for performing an error control coding by increasing the number of multi-values of the multi-value digital signal, and a second decoder for correcting an error of the output of the maximum likelihood decoder. In this case, the first maximum likelihood decoder may be or may not be provided, and, as the second decoder there may be provided with a decoder for directly correcting an error of the output of the demodulator to decode it to the digital signal.

Preferably, the apparatus is provided with a bias circuit for adding a bias signal to the output of the modulator. An output of the bias circuit is recorded on the magnetic recording medium and reproduced.

By the above construction, the direct current components in the recording signal can be fully eliminated. Also, due to the use of the multi-value quadrature amplitude which has high utilization efficiency of frequency, it is possible to use a frequency band of electromagnetic conversion system having a good C/N ratio. When the frequency band is widened to a degree that the S/N ratio or BER (Bit Error Rate) of the reproduced signal is allowable, a resultant increase in the recording rate can be expected than in the base band modulation. Further, due to the Viterbi decoding conducted by deeming the intersymbol interference generated by the frequency characteristic of the magnetic recording/reproducing unit as a convolutional coding, it is possible to prevent the deterioration of the S/N ratio resulting from the frequency equalization. Further, due to the error control coding made by increasing the number of the multi-values of the multi-value digital signal, the error rate can be improved without reducing the bit rate of the data to be actually recorded. Also, due to the prevention of the deterioration of S/N ratio before correcting the error, it is possible to obtain a larger improvement in error rate in correcting errors. Furthermore, due to the use of the bias recording, non-linearity in the electromagnetic conversion system can be alleviated, and the deterioration of the S/N ratio by the distortion of the signal produced by the non-linearity of the electromagnetic conversion system can be reduced. dr

BRIEF DESCRIPTION OF THE DRAWINGS

FIG. 11a is an example of arrangement of the uncoded 8 AMPM signal points;

DESCRIPTION OF THE PREFERRED EMBODIMENTS

Figure 1:
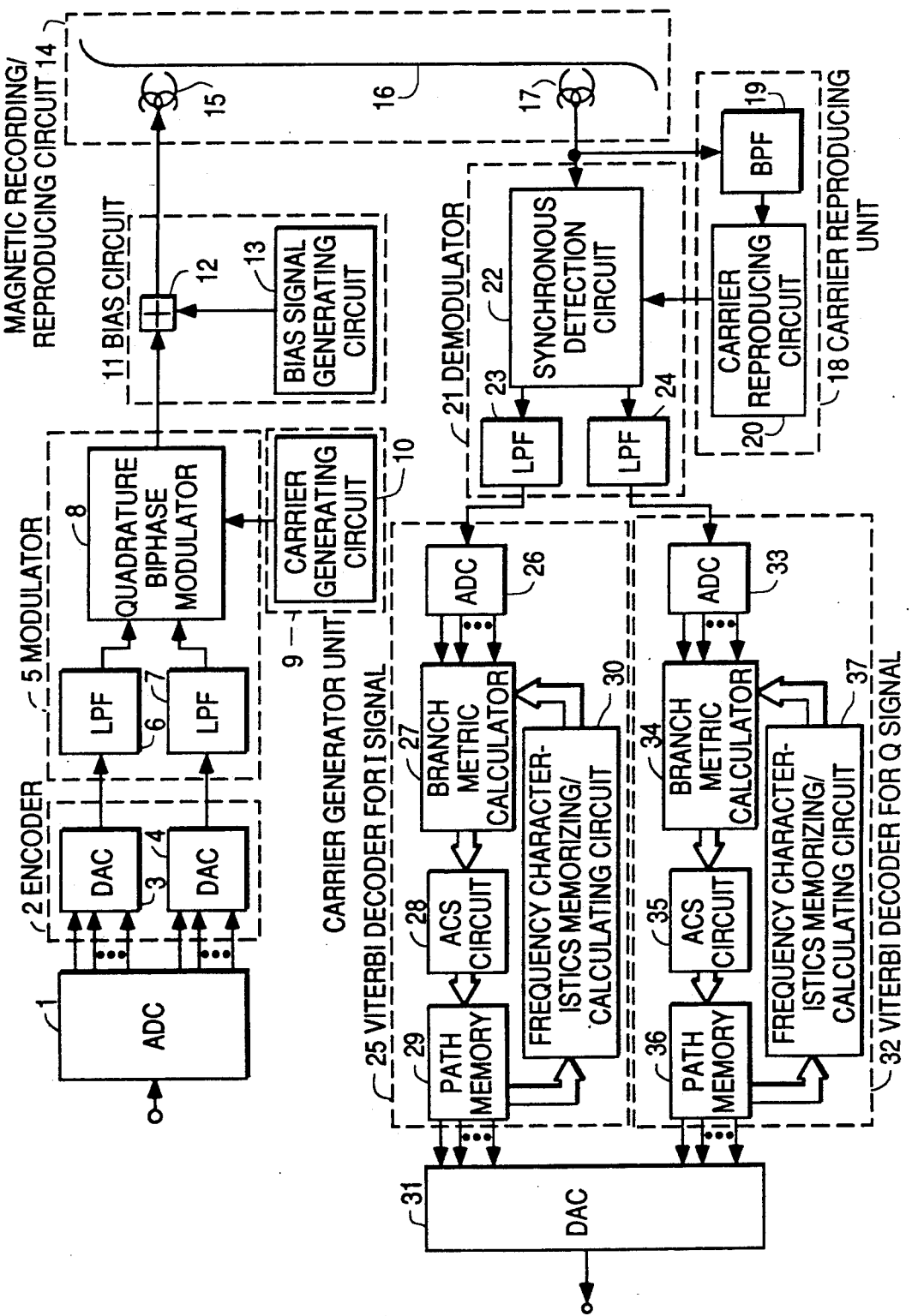
FIG. 1 is a block diagram of a digital signal magnetic recording/reproducing apparatus in the first embodiment of the present invention.

In FIG. 1 there is shown a block diagram of a digital signal magnetic recording/reproducing apparatus in the first embodiment of the present invention. An analog signal such as television signal, audio signal, etc. is converted into a digital signal by an Analog-Digital Converter (hereinafter to be referred to as ADC) 1. The digital signal which is an output of ADC 1 is inputted into an encoder 2, in which it is converted into a multi-value digital signal capable of having plural levels of amplitude by Digital-Analog Converters (hereinafter to be referred to as DAC) 3 and 4. For example, assuming the output from ADC 1 to be a 4-bit data, it is divided into two 2-bit data. Then, they are inputted into DAC 3 and 4 respectively to become the multi-value digital signals each capable of having four values (2 bits).

The outputs of DAC 3 and 4 are inputted into a modulator 5. In the modulator 5, the inputted outputs from DAC 3 and 4 are inputted into Low-Pass Filters (hereinafter to be referred to as LPF) 6 and 7 respectively to undergo band restrictions. The outputs of LPFs 6 and 7 are inputted into a quadrature biphase modulator 8 and subjected to quadrature biphase modulation by using a carrier outputted from a carrier generator 10 in a carrier generating unit 9.

Figure 2A:
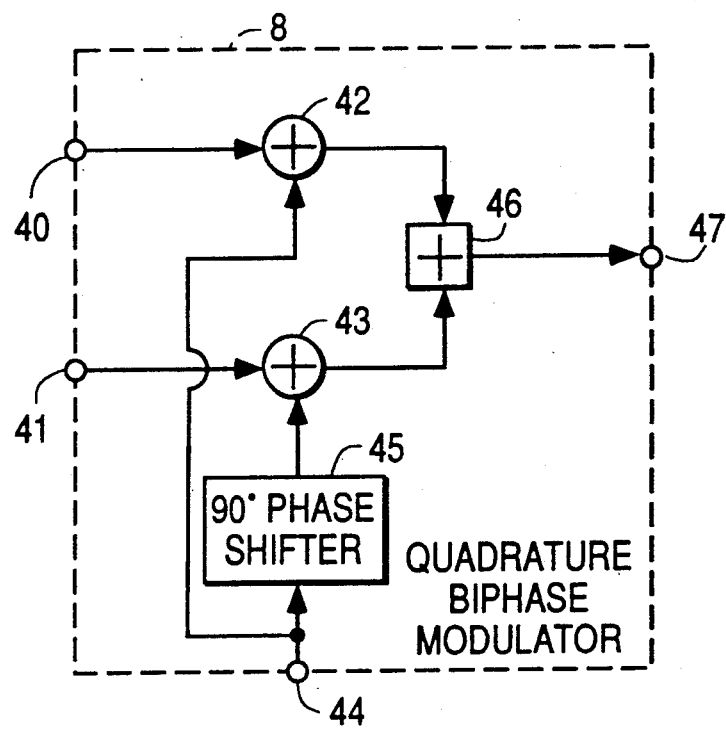
FIG. 2 is a block diagram of a quadrature biphase modulator and a synchronous detection circuit in the digital signal magnetic recording/reproducing apparatus of the present invention.

A concrete bock diagram of the above quadrature biphase modulator 8 is shown in FIG. 2a. It is assumed that the output from the carrier generator 10 is $C(t) = A \cdot \cos \omega_c t$, and the outputs of LPFs 6 and 7 are $d_1(t)$ and $d_2(t)$, respectively. The signals $d_1(t)$ and $d_2(t)$ are the multi-value digital signals each having n levels, where n is an optional integer. If the input bit number of the encoder is 4, the outputs of LPFs 6 and 7 are 4-value digital signals each having four levels of, for example, 1.5, 0.5, −0.5 and −1.5. The outputs $d_1(t)$ and $d_2(t)$ of LPFs 6 and 7 are inputted into balanced modulators 42 and 43 through terminals 40 and 41, respectively. Further, the carrier C(t) inputted through a terminal 44 is inputted into the balanced modulator 42, and on the other hand is subjected to 90° shift of the phase by a phase shifter 45 and inputted into the balanced modulator 43 as $A \cdot \sin \omega_c t$. Outputs of the balanced modulators 42 and 43 are added by an adder 46. The output of the adder 46 is outputted from a terminal 47 as an output S(t) from the quadrature biphase modulator 8. That is to say, $$S(t) = d_1(t) \cdot A \cdot \cos \omega_c t + d_2(t) \cdot A \cdot \sin \omega_c t.$$

Figure 3A:
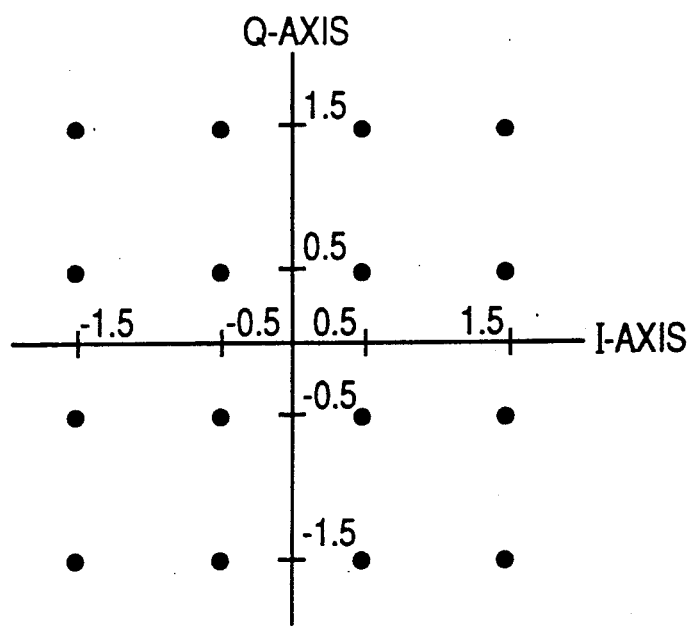
FIG. 3a is a conceptual diagram showing an arrangement of signal points in the complex plane during recording of the digital signal magnetic recording/reproducing apparatus of the present invention.

The output signal from the quadrature biphase modulator 8 can be expressed by a point on the complex plane. An example in the case of the 16 Quadrature Amplitude Modulation (hereinafter to be referred to as 16 QAM) is shown in FIG. 3a. The number of levels in this case is four on each of the In-phase axis which is the same in phase as the carrier (hereinafter to be I axis) and the Quadrature-phase axis which crosses at right angles with the carrier (hereinafter to be I axis), i.e., in each of $d_1(t)$ and $d_2(t)$. The levels of I axis and Q axis respectively take the four values of 1.5, 0.5, −0.5 and −1.5. By the combination of them 16 signal points are generated.

Figure 3B:
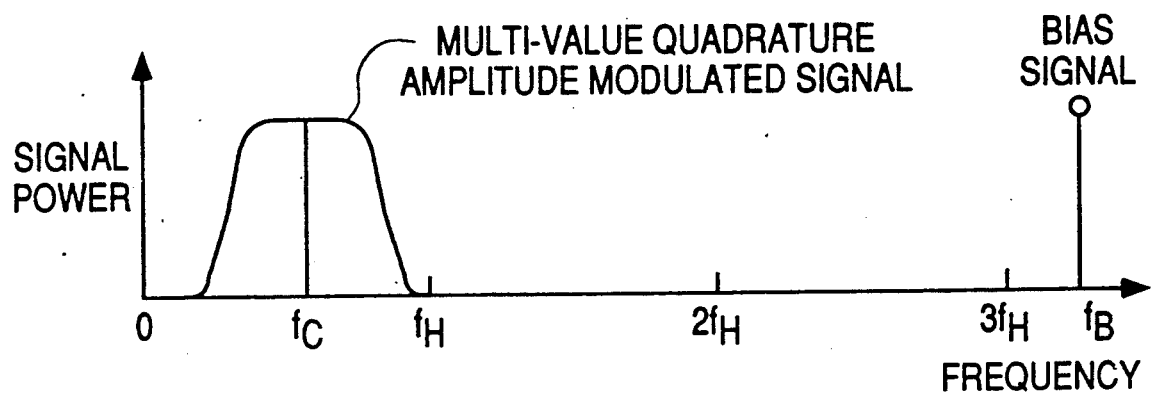
FIG. 3b is a conceptual diagram showing the frequency specrum in recording of the digital signal magnetic recording/reproducing apparatus of the present invention.

The output from the quadrature biphase modulator 8 is inputted into a bias circuit 11, where it is added with a bias signal (frequency bias signal) outputted from a bias signal generating circuit 13 by an adder 12, and the combined signal is outputted. The bias signal frequency $f_B$ is in the following relation with the maximum frequency $f_H$ in the recording signal band: $f_B \geq 3 \cdot f_H$. This relation is shown in FIG. 3b. By this relation, entry of the cross modulation component of $f_B - 2 \cdot f$ into the recording signal band is prevented (where, f is an optional frequency in the recording signal band) Also, the bias current is set such that the composite SN ratio of the SN ratio in the band to be used and the SN ratio by the residual distortion in the band (with the power of distortion to be taken as noise) becomes the maximum. If the bias current is enlarged, the linearity in the electromagnetic conversion system is improved, but the frequency characteristic is deteriorated to aggravate the SN ratio. Therefore, there is an optimum value for the bias current value The output of the bias circuit 11 is inputted to a magnetic recording/reproducing unit 14 and recorded on a magnetic recording medium 16 (e.g., a magnetic tape or a magnetic disc) by a recording head 15.

The signal recorded on the magnetic recording medium 16 is picked up by a reproducing head 17 (which may be the same as the recording head and inputted into a carrier reproducing unit 18 and a demodulator 21. In the carrier reproducing unit 18, the carrier is extracted by a Band-Pass Filter (herein-after to be BPF) 19 which passes the carrier frequency and is inputted into a carrier reproducing circuit 20. The carrier reproducing circuit 20 reproduces the carrier by a method as shown for example in FIG. 17 of the article of G. Ungerboeck, "Channel Coding with Multilevel/Phase Signals" IEEE Trans. on IT, IT-28, No. 1, pp. 55–67, 1982 and outputs it to the demodulator 21.

Figure 2B:
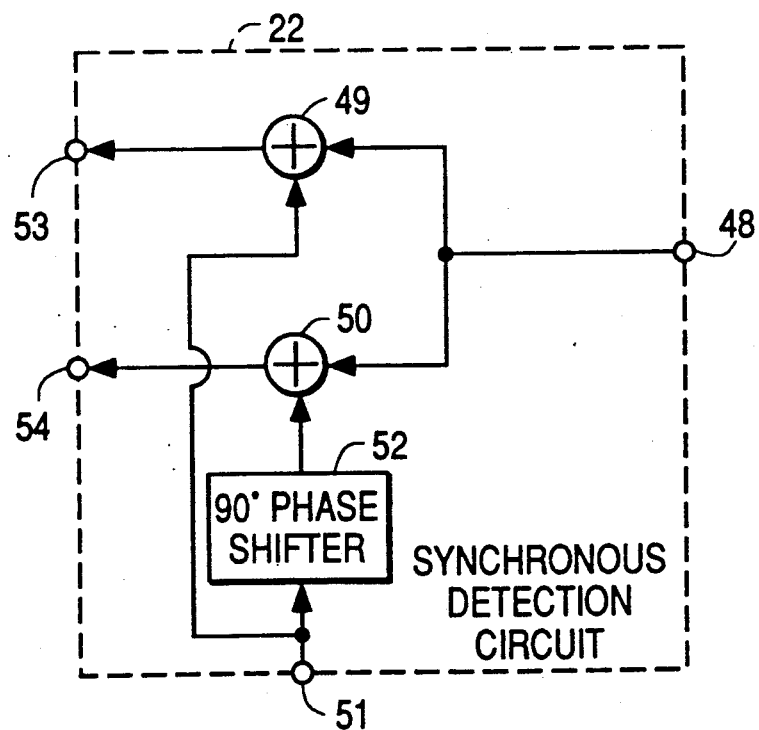

A synchronous detection circuit 22 in the demodulator 21 synchronously detects the reproduced signal from the reproducing head 17 by using the carrier reproduced by the carrier reproducing circuit 20. A concrete block diagram of the synchronous detection circuit 22 is shown in FIG. 2b. The reproduced signal inputted through a terminal 48 is inputted into balanced modulators 49, 50. The carrier reproduced by the carrier reproducing circuit 20 is inputted through a terminal 51. The reproduced carrier is inputted into the balanced modulator 49, and, after undergoing 90° phase shift by a phase shifter 52, is also inputted into the balanced modulator 50. The reproduced signal and the two carriers are respectively multiplied by the balanced modulators 49, 50, and outputted from terminals 53, 54 respectively as the output signals of the synchronous detection circuit 22.

The two channel demodulated signals outputted from the synchronous detection circuit 22 are inputted into LPFs 23 and 24, which pass only the multi-value base band signals The characteristic of each LPF is so adjusted that the characteristic in the combination of LPF 6 or 7 in the modulator with LPF 23 or 24 in the demodulator has a roll-off characteristic free from intersymbol interference.

Figure 4A:
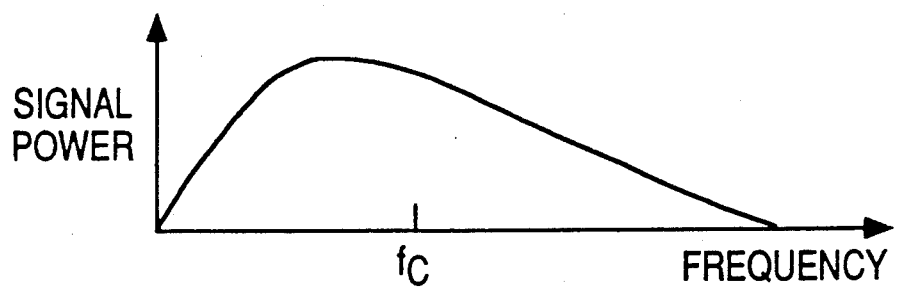
FIG. 4a is a conceptual diagram showing a frequency characteristic of the magnetic recording/reproducing unit of the digital signal magnetic recording/reproducing apparatus of the present invention.
Figure 4B:
FIG. 4b is a conceptual diagram showing the frequency spectrum of the reproduced demodulated signal of the digital signal magnetic recording/reproducing apparatus of the present invention.
Figure 4E:
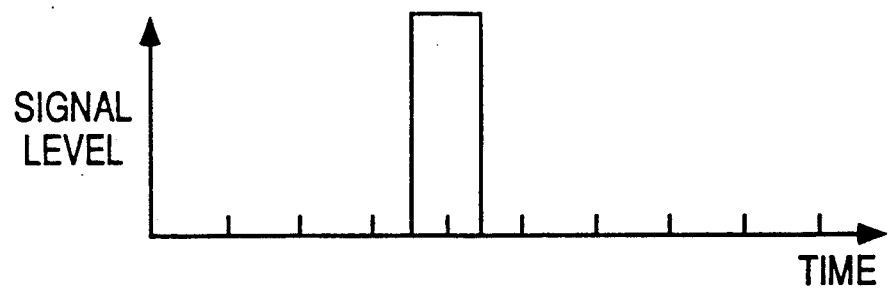
FIG. 4c is a conceptual diagram showing the impulse signal in recording of the digital signal magnetic recording/reproducing apparatus of the present invention.
FIG. 4d is a conceptual diagram showing the reproduced waveform when the impulse signal of FIG. 4c is recorded/reproduced on the magnetic recording/reproducing unit of the digital signal magnetic recording/reproducing apparatus of the present invention.
Figure 4D:
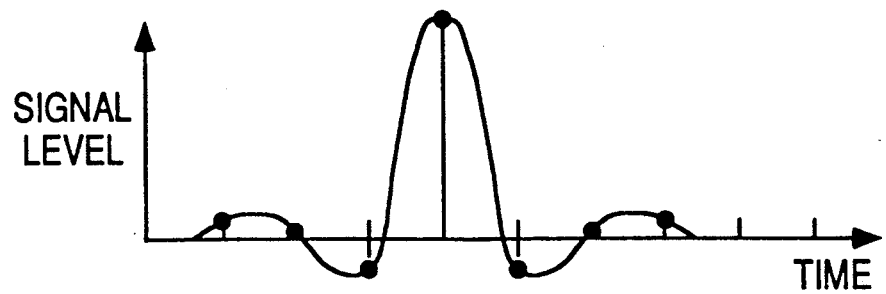

In this case, although the LPF has roll-off characteristics free from intersymbol interference, an intersymbol interference is generated on the reproduced signals due to the frequency characteristic of the magnetic recording/reproducing unit 14. A conceptual view of the frequency characteristic of the magnetic recording/reproducing unit is shown in FIG. 4a. When the magnetic recording/reproducing unit has such a frequency characteristic, the frequency spectrum of the reproduced demodulated signal becomes as shown in FIG. 4b. With the characteristic of the LPF only, the reproduced demodulated signal has a spectrum as shown by the broken line. However, under effect of the frequency characteristic of the magnetic recording/reproducing unit, the frequency spectrum of the reproduced demodulated signal becomes as shown by the solid line. Therefore, when either the In-phase signal having the same phase as the carrier (herein-after to be I signal) or the Quadrature-phase signal crossing at right angles with the carrier (herein-after to be Q signal) has an impulse wave form as shown in FIG. 4c, the reproduced wave form becomes as shown in FIG. 4d. Accordingly, the magnetic recording/reproducing of a certain code effects the preceding and succeeding codes. Against this, in the method of preventing intersymbol interference by frequency equalization, simultaneous deterioration of the SN ratio occurs. In the present invention, deterioration of S/N ratio by frequency equalization is prevented by memorizing the impulse characteristic of FIG. 4b as a frequency characteristic of the magnetic recording/reproducing unit and carrying out Viterbi decoding.

The outputs of LPFs 23, 24 are inputted into a Viterbi decoder 25 for the 1 signal and a Viterbi decoder 32 for the Q signal, respectively. In the Viterbi decoder 25 for the I signal, the inputted signal is converted into a digital signal by an ADC 26.

The output of ADC 26 is inputted into a branch metric calculator 27. The branch metric calculator 27 calculates the likelihood of assumption (branch metrics), of all the combinations, that the input signal is assumed identical with one of the reference signal values reproducible in the encoder 2 (e.g., in case of 16 QAM, four levels of I signal) (hereinafter the sequence of the signal values which ca be generated in the encoder 2 is called path), and that the sequence of the reproduced signal values previously inputted is assumed identical with one of the paths memorized in a path memory 29 (hereinafter called survivor paths). As the survivor path, considering the path of the length of a certain number of clocks, a path which is assumed to be the nearest to the actually recorded path out of all the paths in which the newest value is common is selected. Accordingly, assuming that the number of the values reproducible in the encoder 2 is, for example, 4, there exist four survivor paths. Also, as to the branch metric, there is used a square of the distance between the signal value obtained by adding the intersymbol interference by the assumed survivor path to the assumed reference signal value and the actual value of the input signal.

Figure 5:
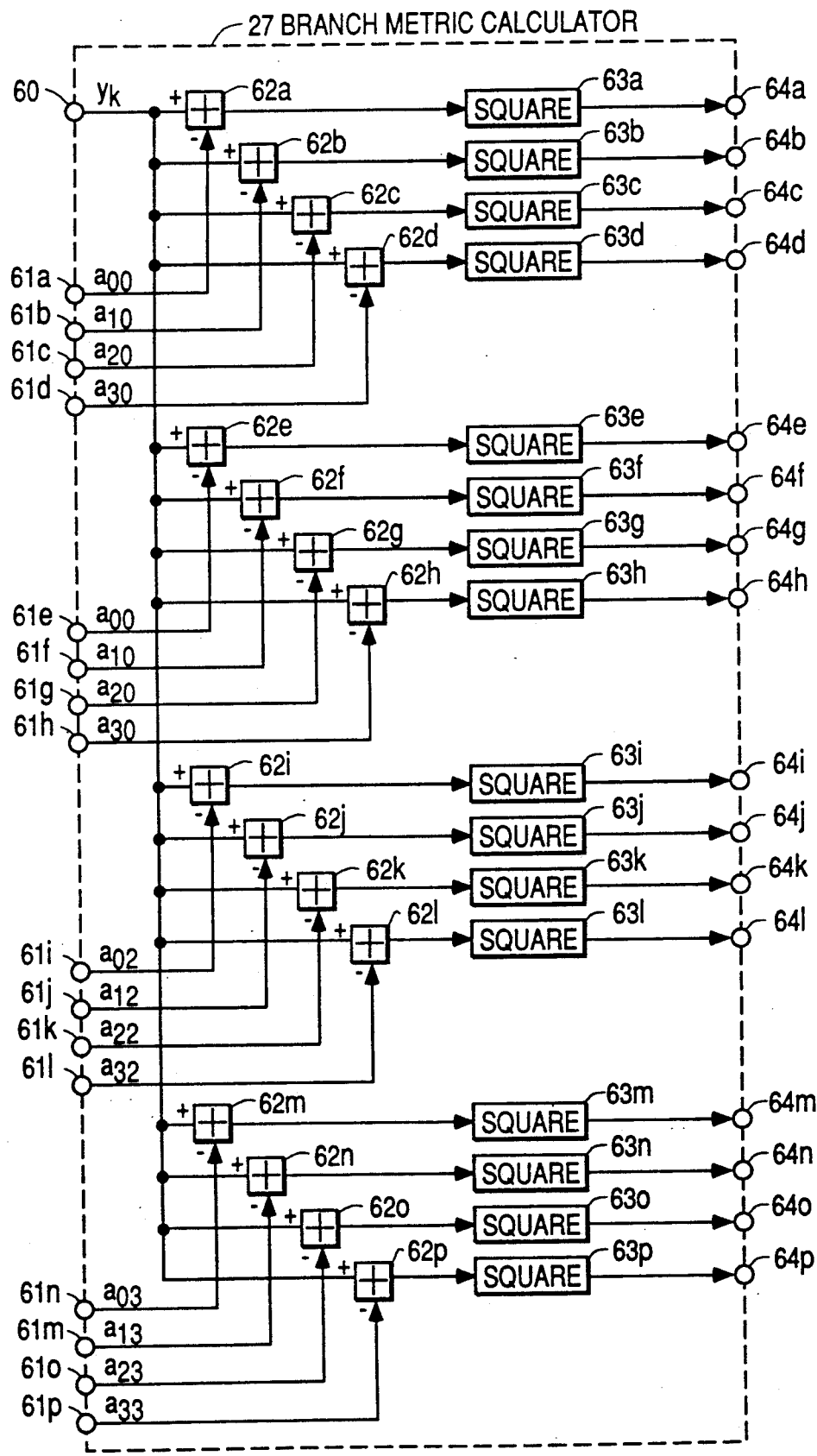
FIG. 5 is a block diagram of a branch metric calculator in the first embodiment of the present invention.

A concrete bock diagram of the branch metric calculator is shown in FIG. 5. It is assumed that an input value yk of the reproduced I signal exerted to an input terminal 60 had a signal value i before being recorded on the magnetic recording medium 16. An amplitude generated in reproducing by a new path which, when the path which is 1 cock before is denoted by a newest signal value j, is obtained by adding the signal value i as the newest value subsequent to the path, according to the frequency characteristic of the magnetic recording-/reproducing unit is set to be an assumed amplitude value aij. The assumed amplitude value aij is calculated in a frequency characteristic memorizing/calculating circuit 30 and applied to a terminal 61. At this time, the branch metric calculator 27 outputs the branch metrics $(yk-aij)^2$ through a terminal 64 to an Add/Compare/Select Circuit (hereinafter, ACS circuit) 28.

Figure 6:
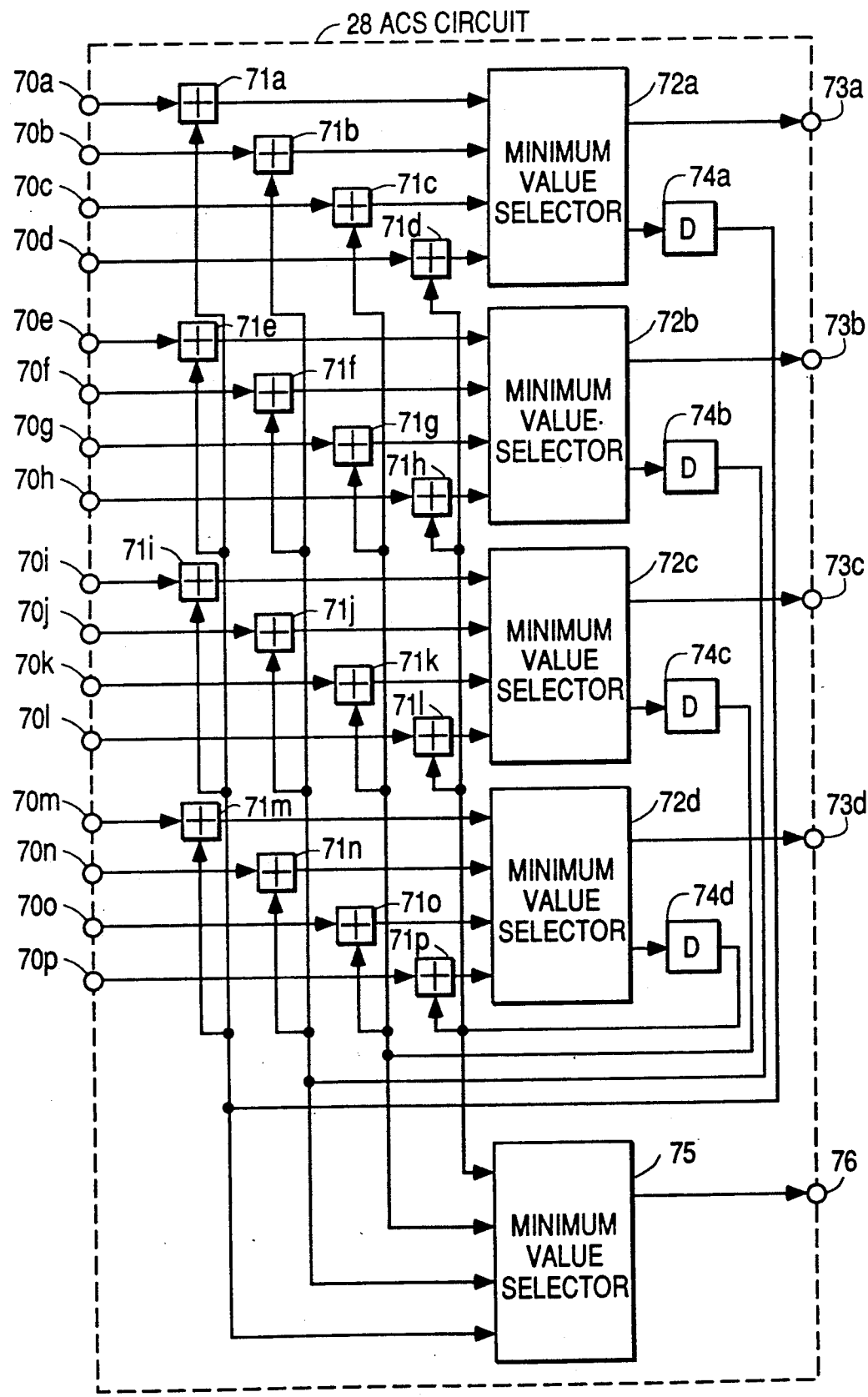
FIG. 6 is a block diagram of an ACS circuit 28 in the first embodiment of the present invention.

ACS circuit 28 adds each inputted branch metric to the likelihood of each survivor path (path metric), compares the result thereof, selects a next survivor path, and renews the content of the path memory 29. As the path metric, the sum of the branch metrics corresponding to the respective signal values of each survivor path is used. A concrete block diagram of the ACS circuit is shown in FIG. 6. The branch metrics applied to a terminal 70 are added by adders 71 to the path metrics which are one clock before memorized in delay elements 74. The added results are compared by minimum value selection circuits 72, signal value sequences which should newly become the survivor paths are selected to change the path metrics, and the contents of the path memory 29 are changed through a terminal 73. Further, the new path metrics are compared by a minimum value selection circuit 75 to select an output of the path memory 29 through a terminal 76.

Figure 7:
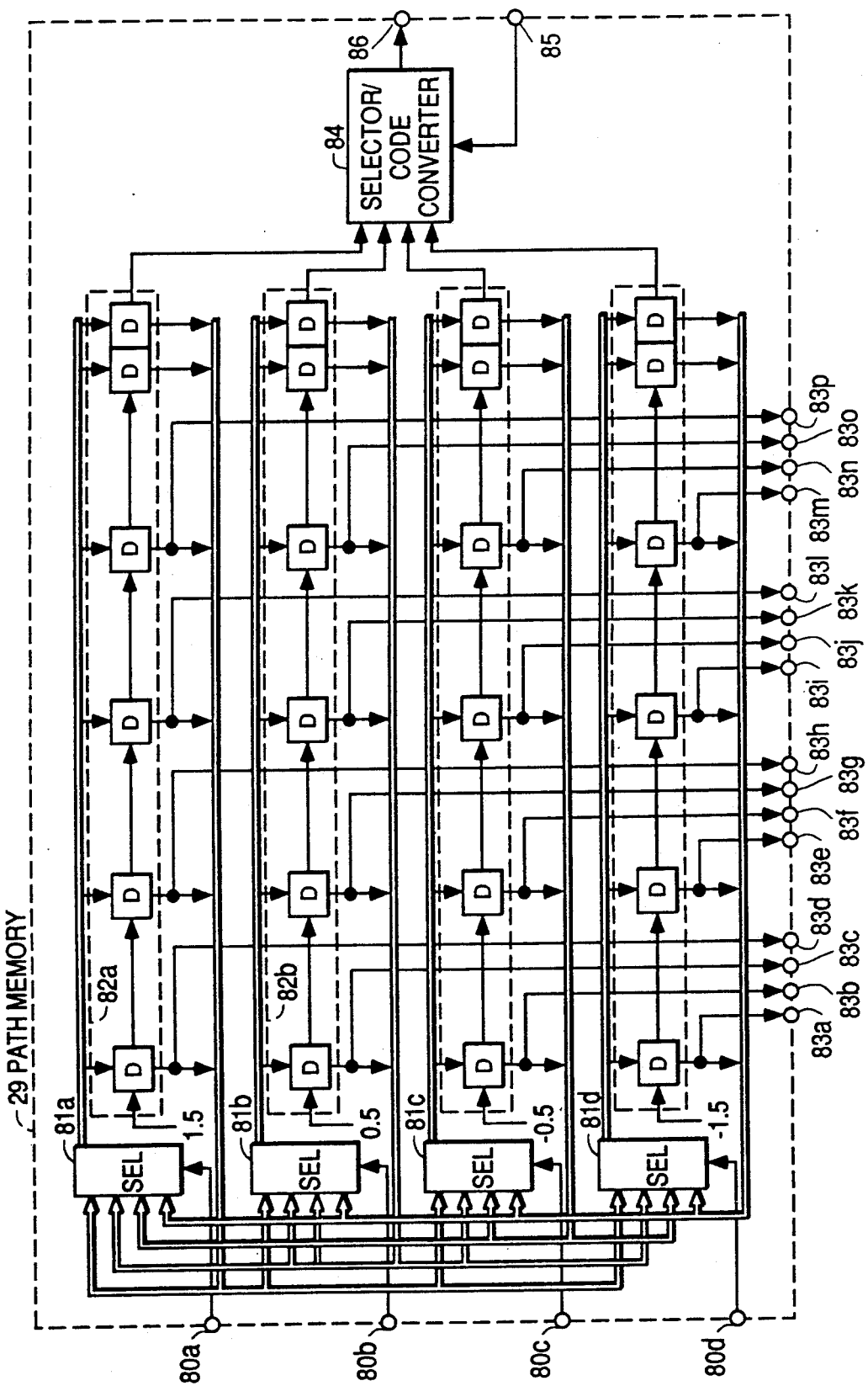
FIG. 7 is a block diagram of a path memory in the first embodiment of the present invention.

The path memory 29 memorizes the survivor paths under the control of the ACS circuit 28. A concrete block diagram of the path memory is shown in FIG. 7. Based on the survivor path selection of the ACS circuit exerted to a terminal 80, survivor paths which are one clock before memorized in shift registers 82 are renewed, followed by shifting them by one clock. Further, new levels are inputted into the registers at the leftmost end in FIG. 7 to make new survivor paths. When the path memory renewing operations proceed, the contents of the previously assumed level, i.e., the contents of the registers at the right part in FIG. 7, gradually come to take a common value. When the most previous levels in all the survivor paths, i.e., the contents in the rightmost end registers in FIG. 7, do not become the same value, the output data is selected by a selector/code converter 84 based on the minimum value selection result of the path metrics exerted to a terminal 85 through the terminal 76 of the ACS circuit 28 and outputted from a terminal 86. In this case, as the values of a signal level are inputted in the path memory, if a digital code corresponding to each level is necessary, a conversion is carried out by the selector/code converter 84. The survivor paths are inputted into a frequency characteristic memorizing/calculating circuit 30 through a terminal 83.

Figure 8:
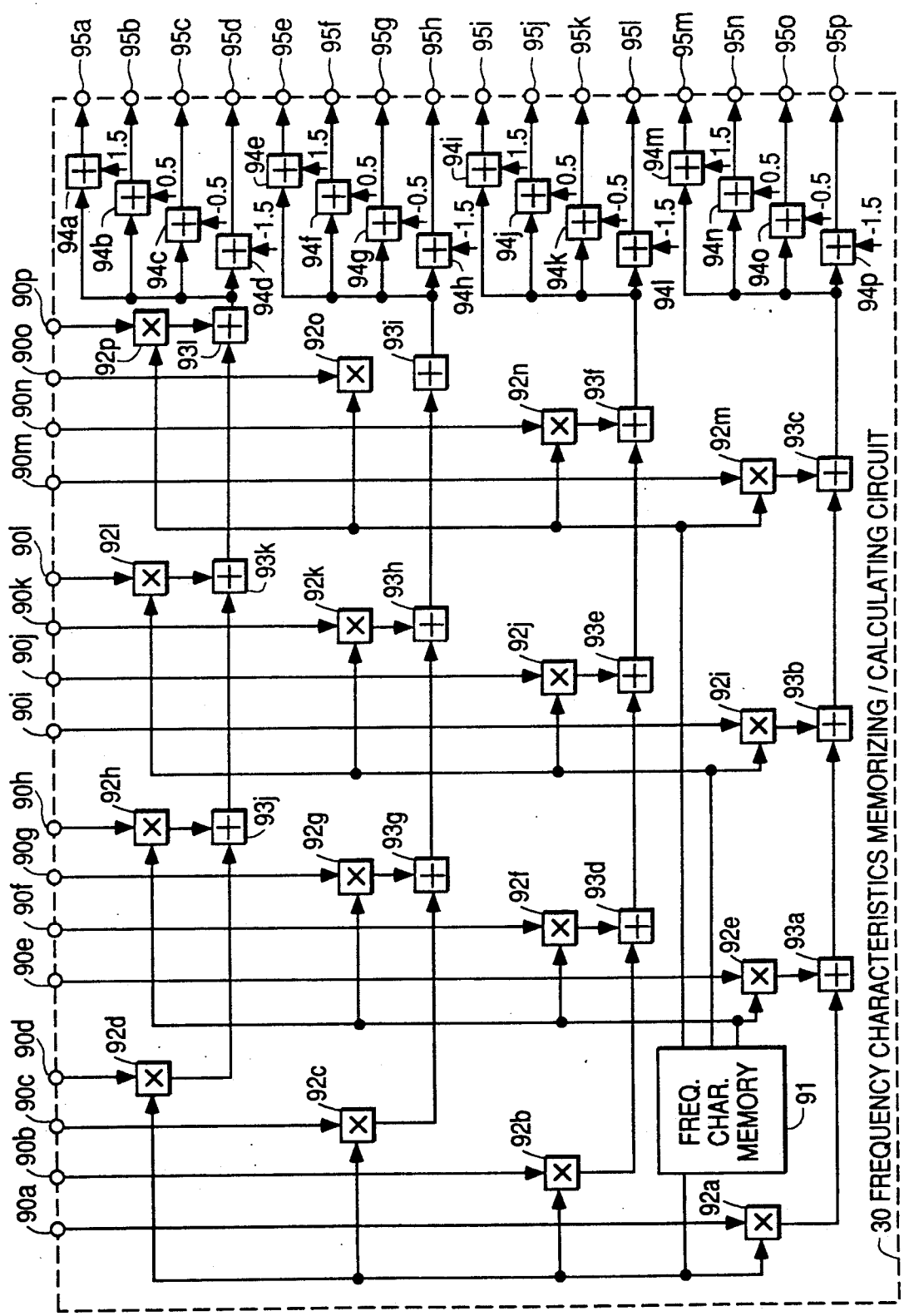
FIG. 8 is a block diagram of a frequency characteristic memorizing/calculating circuit in the first embodiment of the present invention.

The frequency characteristic memorizing/calculating circuit 30 calculates the assumed amplitude values aij of the next data from the inputted survivor paths and supplies them to the branch metric calculator 27. A concrete block diagram of the frequency characteristic memorizing/calculating circuit is shown in FIG. 8. By means of multipliers 92, the survivor paths exerted to a terminal 90 are multiplied the frequency characteristic memorized in a frequency characteristic memory element 91, and their sums are taken by adders 93. To this result, values of the newest levels are added by adders 94 to generate assumed amplitude values aij, which are inputted to the branch metric calculator 27 through a terminal 95.

By the operation as described above, the Viterbi decoder 25 for the I signal detects the level of the I signal without effecting frequency equalization of the reproduced demodulated signal. This relation is entirely the same as in the case of a Viterbi decoder 32 for the Q signal.

The outputs of the Viterbi decoder 25 for the I signal and the Viterbi decoder 32 for the Q signal are inputted into a DAC 31, where they are converted into an analog signal and outputted.

As stated above, in the first embodiment, the frequency characteristic of the magnetic recording/reproducing unit is memorized, and Viterbi decoding is conducted with the intersymbol interference generated for the cause of the frequency characteristic regarded as a convolutional coding. Accordingly, it is possible to detect the level without effecting frequency equalization of the reproduced decoding signal. Consequently, there is no occurrence of deterioration of the S/N ratio by frequency equalization.

Figure 9:
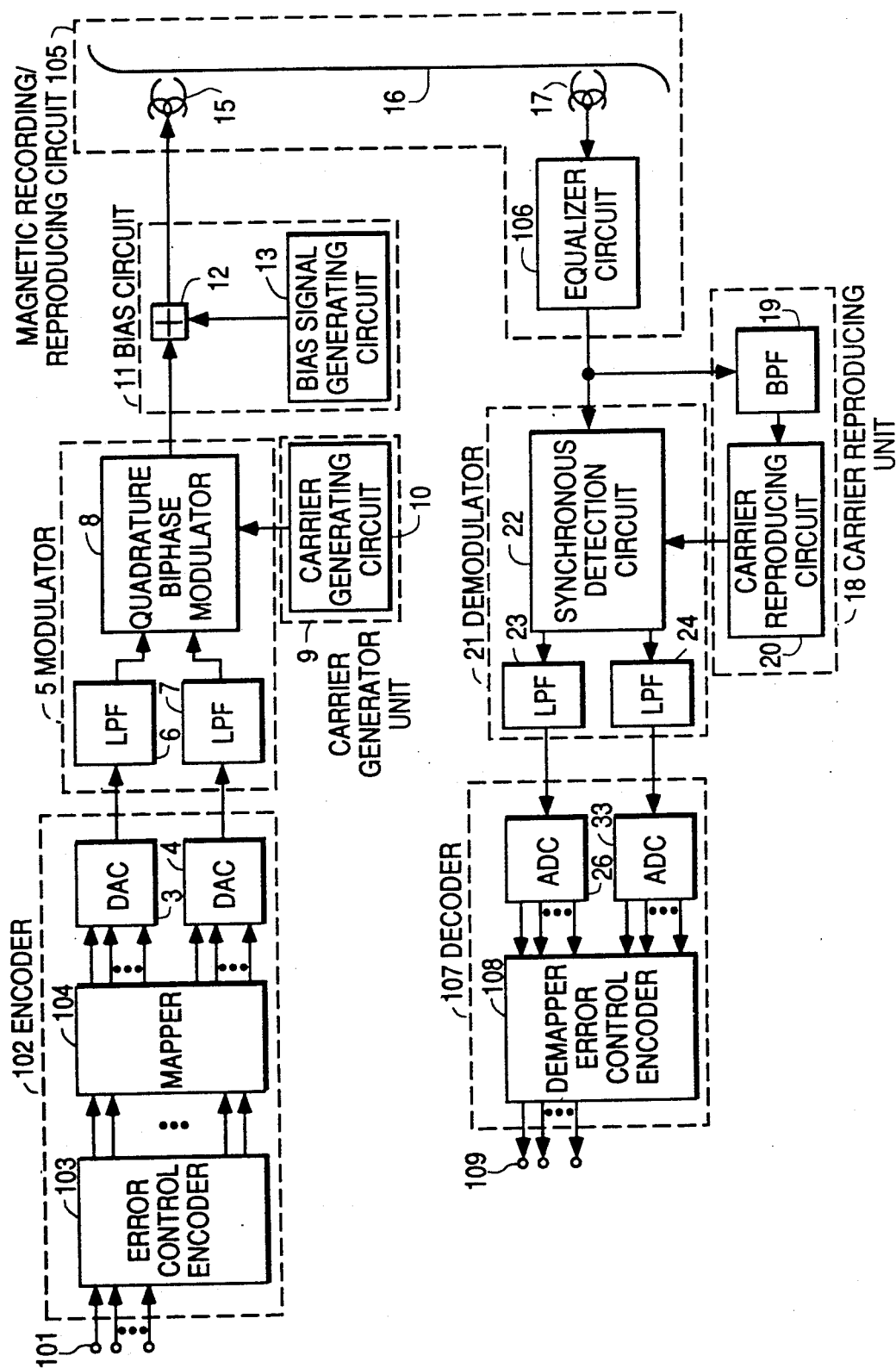
FIG. 9 is a block diagram of a digital signal magnetic recording/reproducing apparatus in the second embodiment of the present invention.

In FIG. 9 a block diagram of a digital signal magnetic recording/reproducing apparatus in the second embodiment is shown In FIG. 9, the differences from the embodiment of FIG. 1 are that an encoder 102 for error control coding performed by increasing the number of the multi-values is provided instead of the encoder 2; that, instead of the Viterbi decoder 25 for the I signal and the Viterbi decoder 32 for the Q signal, a decoder 107 corresponding to the encoder 102 is provided; and that an equalization circuit 106 for frequency equalization of the reproduced output signal is provided between the reproducing head 17 and the carrier reproducing unit 18 and the synchronous detection circuit 22.

The digital signal is inputted into an input terminal 101. The inputted digital signal is inputted into the encoder 102, and is subjected to error control coding by increasing the number of multi-values by an error control encoder 103 in the encoder 102. The output of the error control encoder 103 is converted into an I signal and Q signal by a mapper 104, and then converted into multi-value digital signals each having plural levels of amplitude by the DACs 3 and 4, respectively.

Figure 10:
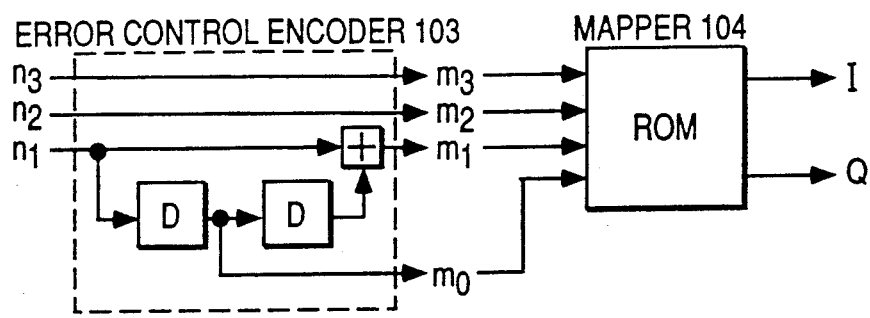
FIG. 10 is an example of construction of an error control encoder and a mapper in the second embodiment of the present invention.
Figure 11B:
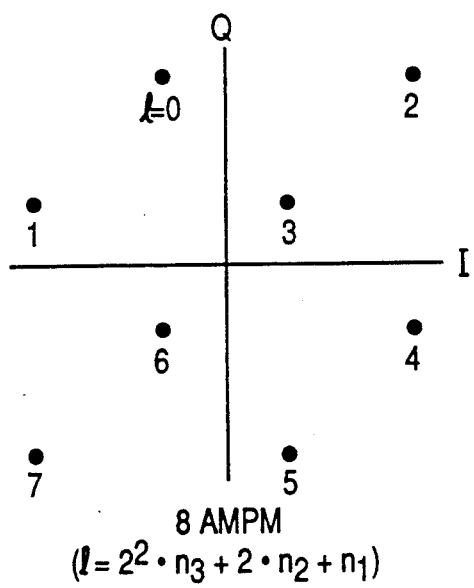
FIG. 11b is an example of arrangement of the coded 16 QAM signal points in the second embodiment of the present invention.
Figure 11B:
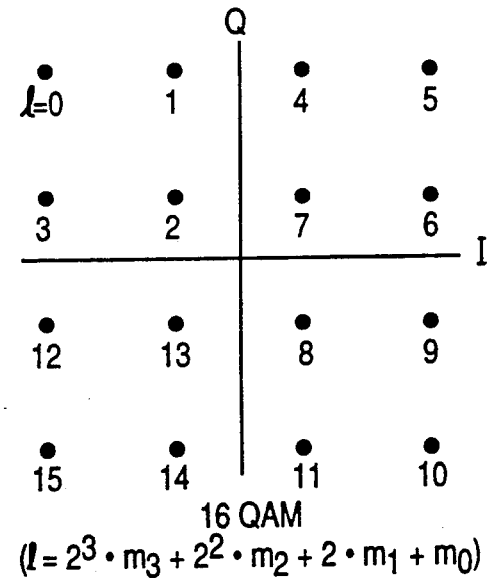

A concrete block diagram of the error control encoder 103 in the case of using the rate ¾ and the binary convolutional codes as the error control codings is shown in FIG. 10, in which an error control capacity is obtained by increasing the number of multi-values of the input digital signal from 8 to 16. Also, the mapper 104 allocates the signals whose number of multi-values increased to 16 to the signal point arrangements as shown in FIG. 11b and converts them into the I signal and Q signal. By constituting as such, it is possible to improve the necessary transmission S/N.

Figure 12A:
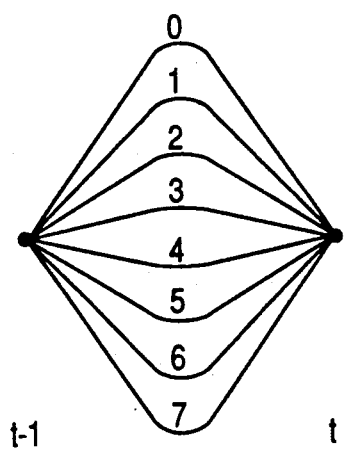
FIG. 12a is a trellis diagram of the uncoded 8 AMPM.
Figure 12B:
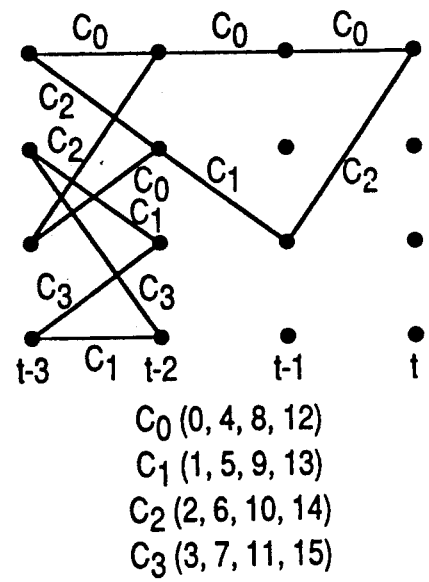
FIG. 12b is a trellis diagram of the coded 16 QAM in the second embodiment of the present invention.

It is assumed that the signal point arrangement in case that error control coding is not made into 8 Amplitude Modulation/phase Modulation (hereinafter to be 8 AMPM) arrangement as in FIG. 11a. In the magnetic recording/reproducing system, the output signal amplitude shows a saturation characteristic against the input signal amplitude, so that the maximum amplitude has to be kept constant even when the number of multi-values varies. Assuming that, when the maximum amplitudes are made the same between FIG. 11a and FIG. 11b, the minimum Euclidean distance between signal points of 8 AMPM in FIG. 11a is X, the minimum Euclid distance between signal points of 16 QAM in FIG. 11b becomes $X/\sqrt{2}$. However, as the rate $\frac{3}{4}$ and binary convolutional codes are used, the so-called free Euclidean distance which is the Euclidean distance between signals which actually becomes effective against error events becomes larger than the above. The trellis diagram for the binary convolutional codes of rate $\frac{1}{2}$ and the number of states 4 becomes as shown in FIG. 12b. The trellis diagram shows the state transition of the encoder in time sequence. The free Euclidean distance, i.e., the minimum value of the total of the Euclidean distances between the two sequences, i.e., until the two sequences which were branched from a certain state come to join again, becomes $2 \cdot X/\sqrt{2}$. Accordingly, as the necessary transmission S/N, improvement can be obtained by 1.5 dB.

Returning to FIG. 9, the outputs of the DACs 3, 4 are inputted into LPFs 6 and 7 and subjected to band restriction. The outputs of LPFs 6, 7 are inputted into the quadrature biphase modulator 8 and are subjected to quadrature biphase modulation by the use of the carrier from the carrier generating unit 9.

The output of the above quadrature biphase modulator 8 is inputted into the bias circuit 11, and is outputted with the addition of the bias signal. The output of the bias circuit 11 is inputted into a magnetic recording/reproducing unit 105 and recorded on the magnetic recording medium 16 (e.g., a magnetic tape, a magnetic disc, etc.) by the recording head 15.

The signal recorded on the magnetic recording medium 16 is taken out by the reproducing head 17, and inputted into an equalizer circuit 106 having no group delay distortion. By the equalizer circuit 106, the high band component deteriorated by the magnetic recording/reproducing is increased so as to make the frequency characteristic of the magnetic recording/reproducing system nearly flat. The output of the equalizer circuit 106 is inputted into the carrier reproducing unit 18 and the demodulator 21. In the synchronous detection circuit 22 in the demodulator 21, the reproduced signal inputted from the equalizer circuit 106 is synchronously detected by the carrier reproduced by the carrier wave reproducing circuit 20. The two decoding signals (I and Q signals) outputted from the synchronous detection circuit 22 which were in quadrature phase are inputted into LPFs 23 and 24, which pass only the multi-value base band signals. The characteristic of each LPF is so made that the characteristic of the combination of the LPF 6 or 7 in the modulator with the LPF 23 or 24 in the demodulator has a roll-off characteristic free from intersymbol interference.

The outputs of LPFs 23, 24 are inputted into a decoder 107. In the decoder 107, the outputs from the LPFs 23, 24 are inputted into ADCs 26 and 33 and converted into digital signals. The outputs of ADCs 26, 33 are inputted into a demapper/error control decoder 108, and, after correction of the errors which occurred during recording/reproducing, outputted from an output terminal 109 as a digital signal.

Figure 13:
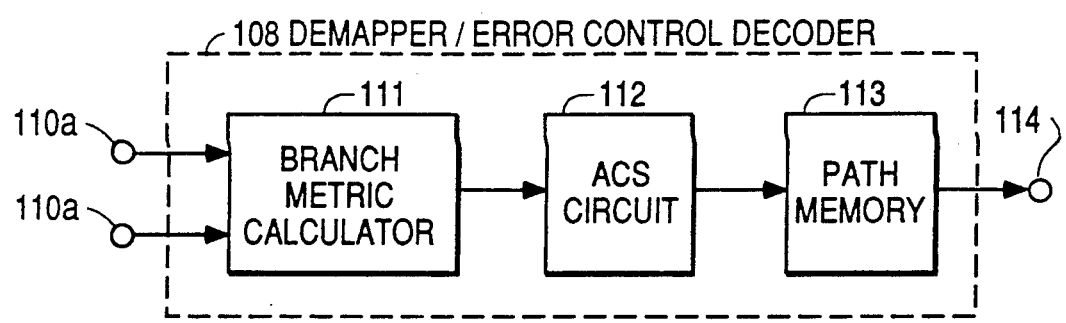
FIG. 13 is a block diagram of a demapper/error control encoder in the second embodiment of the present invention.
Figure 14:
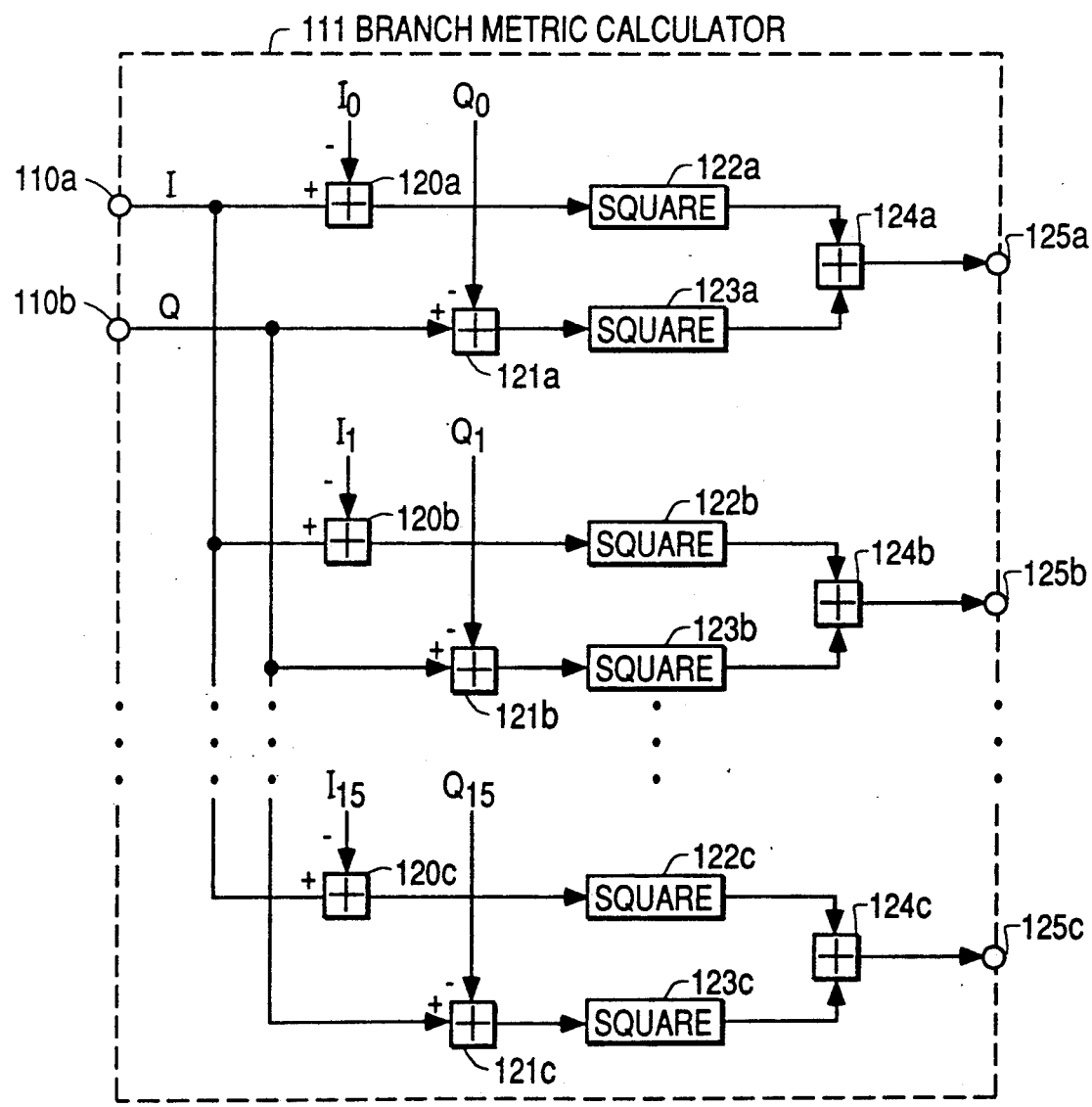
FIG. 14 is a block diagram of a branch metric calculator in the second embodiment of the present invention.

A concrete block diagram of the demapper/error control decoder 108 is shown in FIG. 13. The error correction is carried out by the Viterbi decoding The outputs of ADCs 26, 33 are inputted through terminals 110a and 110b into a branch metric calculator 111. The branch metric calculator 111 calculates the likelihood of the assumption (branch metric) that the input signal is assumed a specific one of the 16 signal points of 16 QAM. As a branch metric, there is used a square of the distance between the reproduced signal point and the reference signal point which is producible by the encoder 102, on the two dimensional coordinates as shown in FIG. 7. A concrete block diagram of the branch metric calculator 111 is shown in FIG. 14. The I signal (value I) and the Q signal (value exerted to the input terminal 110 are assumed to be identical with the output signal point i of the encoder 102. Also, the value of the 1 axis of the signal point i is assumed to be Ii, and the value of the Q axis to be Qi. At this time, the branch metric calculator outputs the branch metric $[(I-Ii)^2+(Q-Qi)^2]$ to an ACS circuit 112 through a terminal 125.

The outputted branch metric is used for the selection of the survivor path and the selection of the output decoding signal. The sequence of the signals producible in the encoder 102 is called a path. As to the survivor path, when the path of a length of a certain number of clocks is considered, there is selected a path which has been assumed to be the nearest to the path actually recorded out of all the paths in which the state of the error control coder 103 after the generation of the above path is common. Accordingly, assuming that the number of the states that can be taken in the error control encoder 103 is for example 4, there exist four survivor paths.

Figure 15:
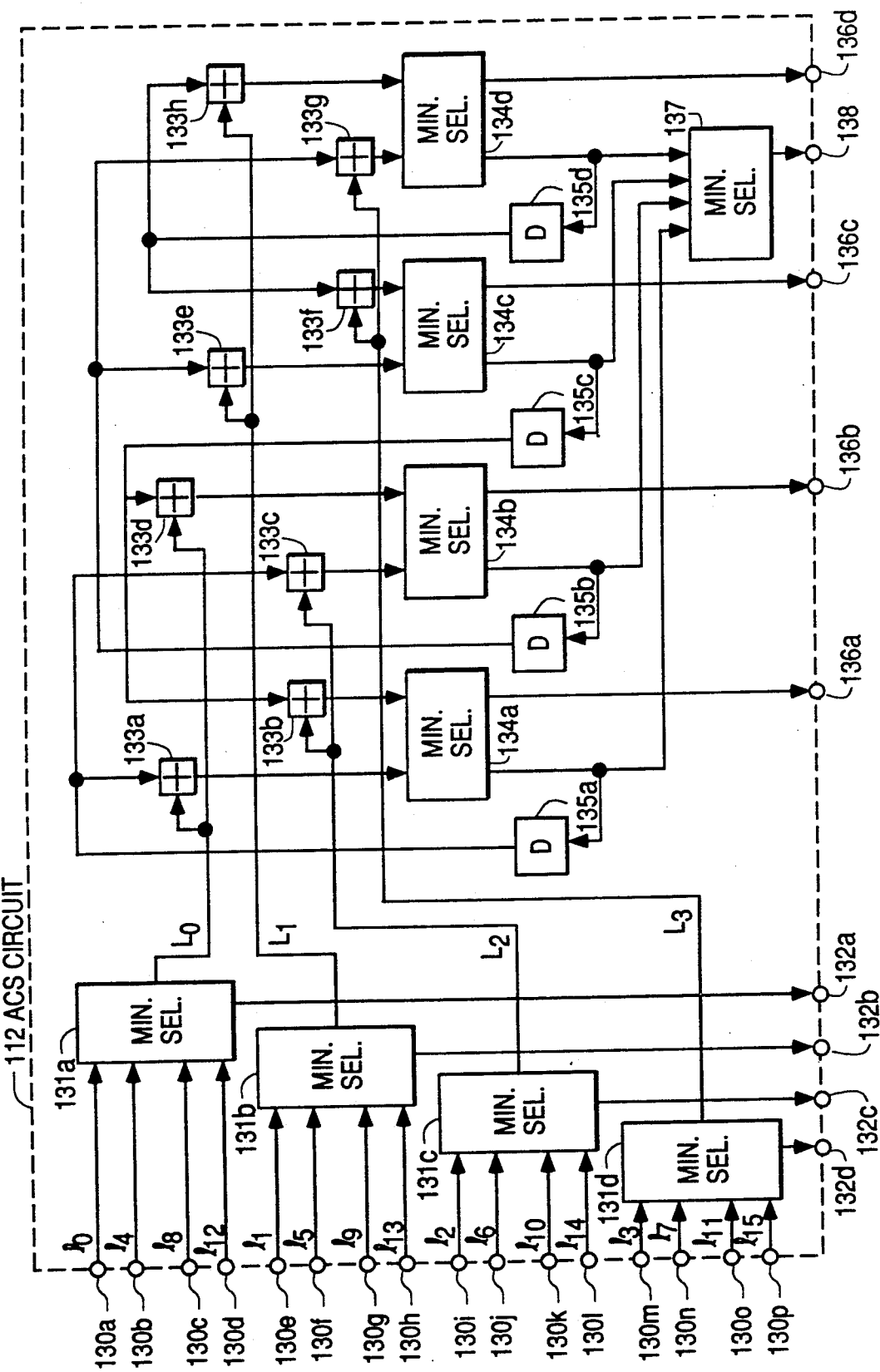
FIG. 15 is a block diagram of an ACS circuit in the second embodiment of the present invention.

The ACS circuit 112 adds the branch metric to the path metric of the survivor path, compares the result thereof, selects a next survivor path, and changes the content in a path memory 113. As a path metric, the total of the branch metrics corresponding to the respective signal values of each survivor path is used. A concrete block diagram of the ACS circuit 112 is shown in FIG. 15. The branch metric exerted to a terminal 130 is firstly inputted to a minimum value selector 131. As to the minimum value selector 131, out of the signals which are producible by 4 each of each path of the trellis diagram, the one which is the nearest to the receiving signal is selected based on the inputted branch metric value, and the branch metric corresponding to the result thereof is outputted. At the same time, the input of the path memory 113 is selected through a terminal 132. The branch metric outputted from the minimum value selector 131 is added by an adder 133 to the path metric which is 1 clock before memorized by a delay element 135. The result of this is compared by a minimum value selection circuit 134, and the signal value sequences which newly become survivor paths are selected to change the path metrics At the same time, the contents of the path memory ar changed through a terminal 136. Also, the new path metric which are the result of this are compared by a minimum value selection circuit 137, and an output of thé path memory 113 is selected through a terminal 138.

Figure 16:
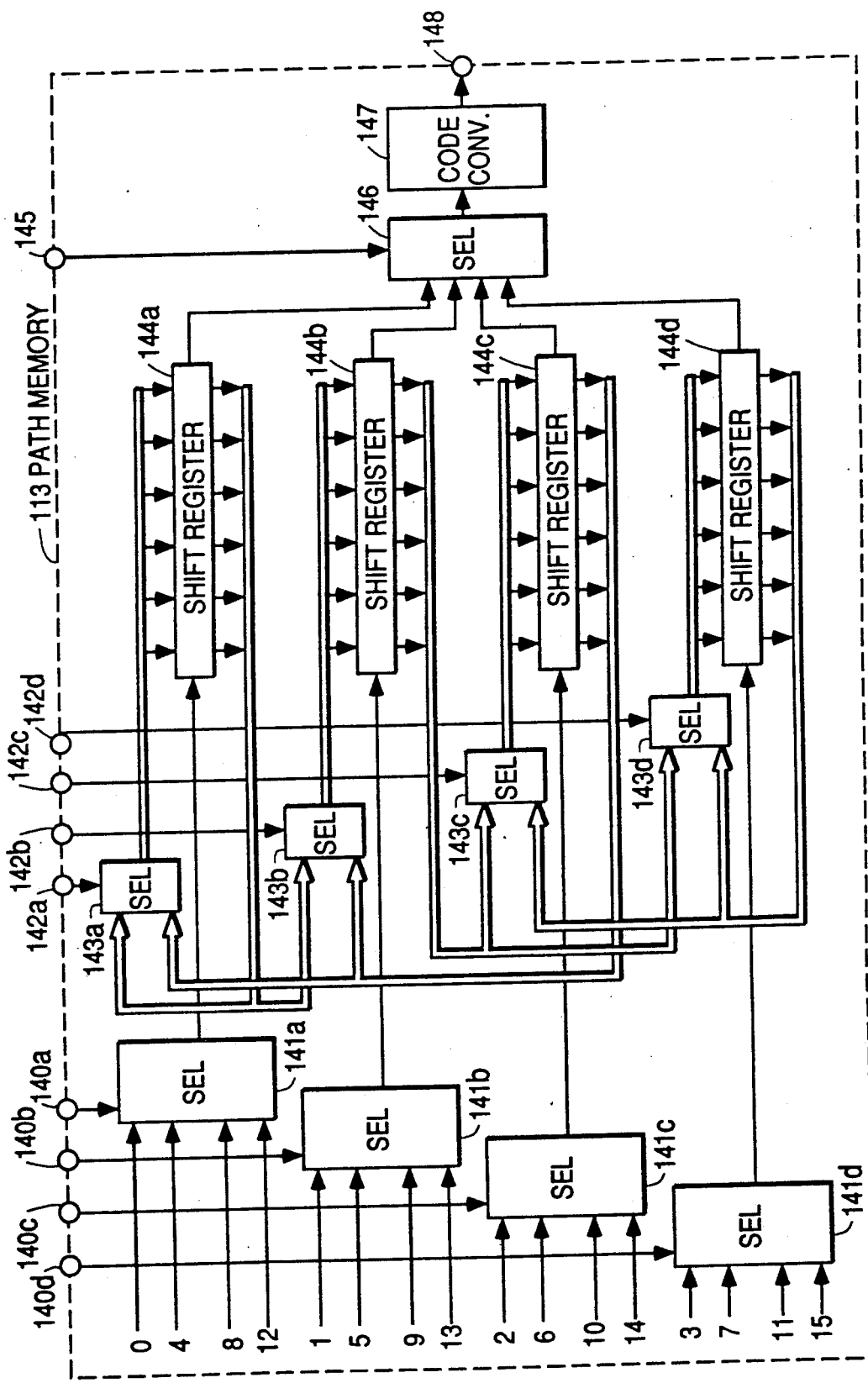
FIG. 16 is a block diagram of a path memory in the second embodiment of the present invention.

The path memory 113 memorizes the survivor paths under the control of the ACS circuit 112. A concrete block diagram of the path memory 113 is shown in FIG. 16. Based on the result of selection of the survivor paths of the ACS circuit exerted to a terminal 141, the survivor paths of 1 clock before which are memorized in shift registers 144 are renewed. Then, the contents of the shift registers are shifted by one clock. Further, based on the result of selection by the minimum value selector 131 exerted to a terminal 140, the signals assumed from the present receiving signal are inputted to the latest registers, i.e., at the leftmost end in FIG. 16 to make a new survivor path. When the path memory renewing operations proceed, the previously assumed signals, i.e., the contents of the registers at the rightmost end in FIG. 16, gradually come to take a same value. When the oldest signals in all the survivor paths, i.e., the contents in the registers at the rightmost end in FIG. 16, fail to take the same value, an output data is selected by a selector 146 based on the result of selection of the minimum value of the path metrics exerted to a terminal 145 through the terminal 138 of the ACS circuit 112 and outputted to a terminal 148 through a code converter 147.

Figure 17:
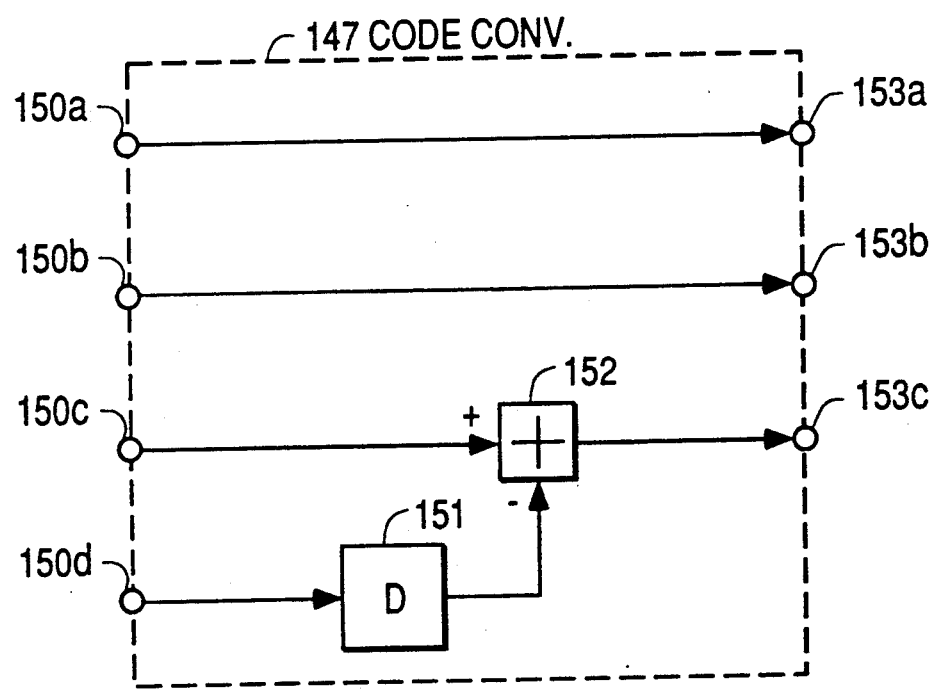
FIG. 17 is a block diagram of a code converter in the second embodiment of the present invention.

A concrete block diagram of the code converter 147 is shown in FIG. 17. As the coding is made on the recording side as shown in FIG. 10, such conversion is necessary on the reproducing side after correcting the errors.

As described above, according to the second embodiment, by providing the encoder 102 for error control coding increasing the number of multi-value levels of the multi-value digital signals and the decoder 107, the error rate can be improved against the deterioration of the S/N ratio generated during the magnetic recording-/reproducing.

In the second embodiment, the hardware can be more simplified than in the first embodiment by the portion in which there is no Viterbi decoders for the I signal and for the Q signal, although the S/N ratio is deteriorated by the portion of the frequency equalization.

Figure 18:
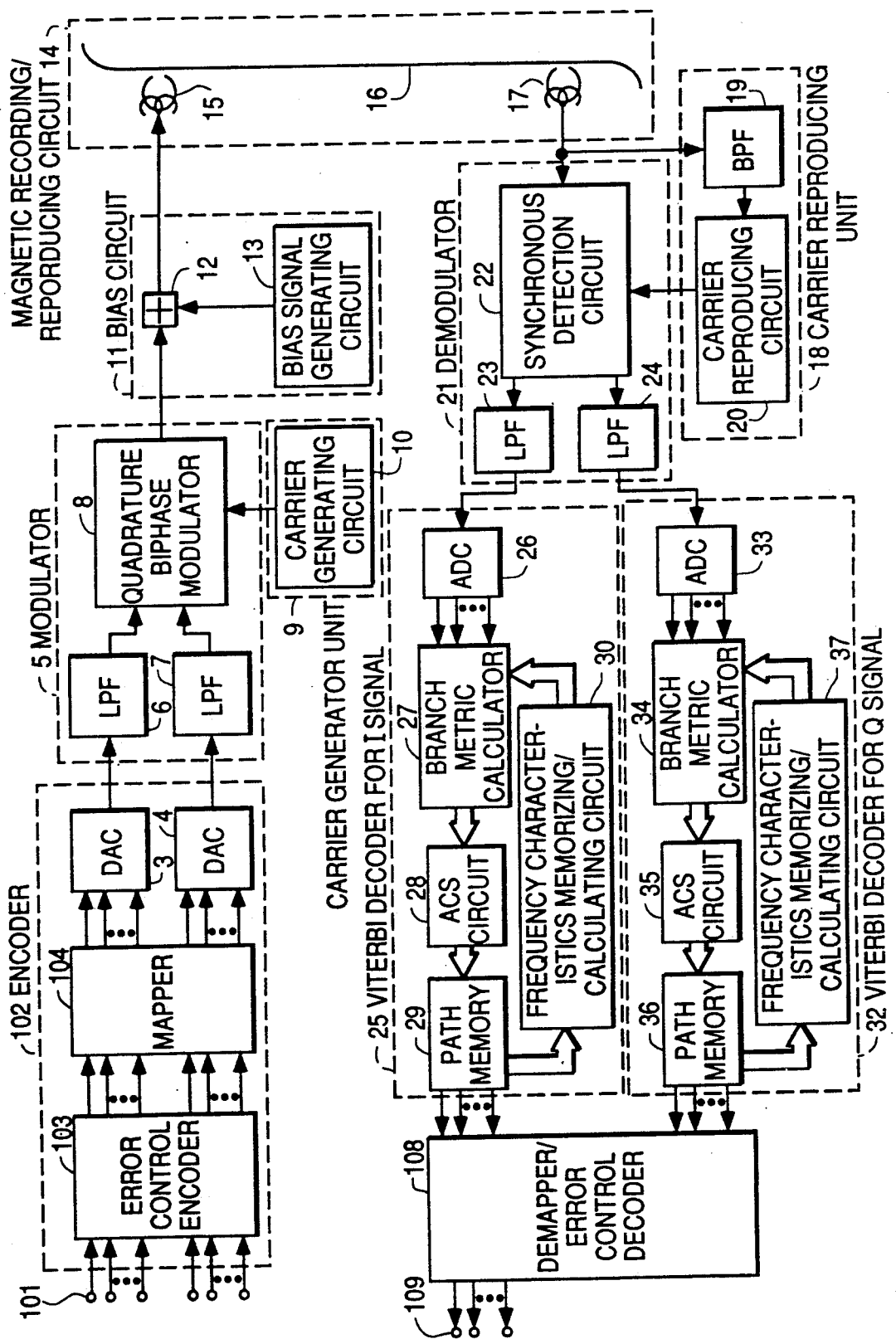
FIG. 18 is a block diagram of a digital signal magnetic recording/reproducing apparatus in the third embodiment of the present invention.

In FIG. 18, there is shown a block diagram of a digital signal magnetic recording/reproducing apparatus in the third embodiment of the present invention.

In FIG. 18, differently from the embodiment of FIG. 1, an encoder 102 for error control coding by increasing the number of multi-values of the multi-value digital signals is provided in place of the encoder 2. Further, a demapper/error control decoder 108 corresponding to the encoder 102 is connected to the outputs of the Viterbi decoder 25 for the I signal and the Viterbi decoder 32 for the Q signal. Different from the embodiment of FIG. 9, instead of using an equalizer circuit 106, the Viterbi decoder 25 for the I signal and the Viterbi decoder 32 for the Q signal are used.

The digital signal is inputted into the input terminal 101. The inputted digital signal is inputted into the encoder 102, and subjected to error control coding with an increase of the number of multi-values by means of the error control encoder 103 in the encoder 102. The output of the error control encoder 103 is converted into the I signal and signal by the mapper 104, and converted into the multi-value digital signals each having plural levels of amplitude by means of DACs 3 and 4, respectively.

The outputs of DACs 3 and 4 are inputted into the demodulator 5. In the demodulator 5, the outputs of the inputted DACs 3, 4 are inputted into LPFs 6 and 7 and subjected to band restrictions. The outputs of DACs 3, 4 are inputted to the quadrature biphase modulator 8, and subjected to quadrature biphase modulation by the use of the carrier wave of the output of the carrier wave generator unit 9. The output of the above quadrature biphase modulator 8 is inputted into the bias circuit 11, and outputted with the addition of the bias signal. The output of the bias circuit 11 is inputted into the magnetic recording/reproducing unit 14 and recorded on the magnetic recording/reproducing medium 16 (e.g., magnetic tape, magnetic disc, or the like) by the recording head 15.

The signal recorded on the magnetic recording medium 16 is taken out from the reproducing head 17, and inputted into the carrier wave reproducing unit 18 and the demodulator 21. The carrier wave reproducing unit 18 extracts the carrier wave component by the BPF 19 which passes the carrier wave frequency and inputs it into the carrier wave reproducing circuit 20. In the carrier wave reproducing circuit 20, the carrier wave is reproduced and outputted to the demodulator 21. In the synchronous detection circuit 22 in the demodulator 21, the reproducing signal inputted from the reproducing head 17 is synchronously detected by the carrier wave reproduced by the carrier wave reproducing circuit 20. The two demodulated signals in quadrature phase of the output of the synchronous detection circuit 22 are inputted into LPFs 23 and 24, which pass only the multi-value base band signals. The characteristic of each LPF is so made that the combined characteristic of the LPF 6 or 7 in the modulator and the LPF 23 or 24 in the demodulator has a roll-off characteristic without inter-symbol interference.

The outputs of the LPFs 23, 24 are inputted into the Viterbi decoder 25 for the I signal and the Viterbi decoder 32 for the Q signal, respectively. In the Viterbi decoder 25 for the I signal, the LPF 23 output is inputted into ADC 26 and converted into a digital signal.

The output of the ADC 26 is inputted into the branch metric calculator 27. The branch metric calculator calculates, based on the assumed amplitude value fed from the frequency characteristic memorizing/calculating circuit 30, the branch metric when assumed that the input signal is identical with one of the reference signal values producible in the encoder 2 (i.e., in case of 16 QAM, four levels of I signal) and further that the sequences of the previously inputted reproduced signal values are identical with one of the survivor paths, and outputs it to the ACS circuit 28.

The ACS circuit 28 adds the inputted branch metrics to the path metrics of the survivor paths, compares the result thereof, selects the next survivor paths, and changes the contents of the path memory 29. As to the path metric, a sum total of the branch metrics corresponding to the respective signal values of each survivor path is used.

The path memory 29 memorizes the survivor paths under the control of the ACS circuit. A concrete block diagram of the path memory is shown in FIG. 7. When the replacement operation of the path memory proceeds, the previously assumed levels, i.e., the contents of the registers at the rightmost end in FIG. 7, gradually come to take a common value. If the oldest levels in all the survivor paths, i.e., the contents of the registers at the rightmost end in FIG. 7, have not become the same value, an output data is selected on the basis of the result of selection of the minimum value of the path metrics in the ACS circuit and outputted to the demapper/error control decoder 108. Also, the survivor paths are inputted into the frequency characteristic memorizing/calculating circuit 30.

The frequency characteristic memorizing/calculating circuit 30 calculates the assumed amplitude values of the following data from the inputted survivor paths and inputs them into the branch metric calculator 27.

By the operation as described above, the Viterbi decoder 25 detects the level of the I signal without effecting frequency equalization of the reproduced demodulated signal. The operation is entirely the same in the Viterbi decoder 32 for the Q signal.

The outputs of the Viterbi decoder 25 for the I signal and the Viterbi decoder 32 for the Q signal are inputted to the demapper/error control decoder 108, and, after correction of the errors which occurred during the recording/reproducing, outputted as a reproduced digital signal from the terminal 109.

As described above, in the third embodiment, by providing an encoder 102 for error control coding by increasing the number of multi-values of the multi-value digital signals and the demapper/error control decoder 108, the error rate can be improved against the deterioration of the S/N ratio produced during magnetic recording/reproducing. Here, unlike in the second embodiment, the frequency characteristic of the magnetic recording/reproducing unit is memorized and Viterbi decoding operation is performed by regarding the intersymbol interference generated for the cause of the frequency characteristic as a convolutional coding, so that it is possible to detect the level without effecting frequency equalization of the reproduced demodulate signals. Consequently, no deterioration of the S/N ratio by frequency equalization occurs. Accordingly, according to the portion of improvement to S/N ratio of the inputs into demapper/error control decoder 108, the effect of the error control coding is more largely produced.

Although no detailed description has been made on the input bit number of DAC in the embodiments (1st to 3rd) of the present invention, the input bit number of DAC may be an optional integer. Further, although reference has been made only on the case of using the Viterbi decoding, other maximum likelihood decoding such as Syndrome decoding may be used. Further, although there has not been shown constructions using the carrier reproducing circuit such as Costas scheme or the clock reproducing circuit, if they are co-used, the reproduction precision can be more improved. Furthermore, if the inputted digital signal is made into a differential-coded digital signal, the phase correction of the carrier wave is simplified in the carrier reproducing unit.

In the embodiments (1st to 3rd) of the present invention, description has been made on the case of using the multi-value quadrature amplitude modulation, but the similar effect can be obtained by other modulation systems such as amplitude phase modulation (APSK), phase modulation (PSK), frequency modulation (FSK), and the like.

What is claimed is:
1. A digital signal magnetic recording/reproducing apparatus comprising:

encoding means for converting an inputted digital signal into two multi-value digital signals;

carrier generating means for generating a carrier;

modulation means for subjecting the multi-value digital signals to quadrature biphase modulation using the carrier to obtain a modulated signal;

magnetic recording/reproducing means for recording the modulated signal on a magnetic recording medium and reproducing the recorded signal;

carrier reproducing means for reproducing the carrier from the reproduced signal from the magnetic recording/reproducing means;

demodulating means for demodulating the reproduced signal from the magnetic recording/reproducing means into reproduced multi-value digital signals by using the carrier reproduced by the carrier reproducing means; and decoding means for subjecting the reproduced multi-value digital signals to maximum likelihood decoding regarding an effect of a frequency characteristic of said magnetic recording medium upon the modulated signal as a convolutional coding thereby to obtain a reproduced digital signal.

2. A digital signal magnetic recording/reproducing apparatus according to claim 1, wherein the decoding means comprises:

memorizing means for memorizing a plurality of signal sequences which become candidates for an output signal;

frequency characteristic memorizing and calculating means for memorizing the frequency characteristic of the magnetic recording medium, calculating amplitude values which are to be added to subsequent signal values due to effect of the plurality of signal sequences by using the frequency characteristic and the plurality of signal sequences memorized in the memorizing means, and calculating from the amplitude values assumed amplitude values when values next to the reproduced multi-value digital signals are assumed by all multi-value digital signal values producible by the encoding means;

branch metric calculating means for calculating distances between the assumed amplitude values from the frequency characteristic memorizing and calculating means and the values of the reproduced multi-value digital signal from the demodulating means; and adding, comparing and memorizing means for summing the distances from the branch metric calculating means to generate branch metric values of all the producible signal sequences successively to the plurality of signal sequences memorized in the memorizing means, comparing the branch metric values, controlling the memorizing means according to the result of comparison, outputting the most previously assumed signal value out of the most likely signal sequences from the memorizing means, and selecting the plural signal sequences which become the candidates for the next output signals to output them into the memorizing means.

3. A digital signal magnetic recording/reproducing apparatus according to claim 1, further comprising bias means for adding a bias signal to the modulated signal before recording.

4. A digital signal magnetic recording/reproducing apparatus according to claim 3, wherein the bias means comprises:

bias signal generating means for generating the bias signal for minimizing a non-linear distortion of the reproduced signal from the magnetic recording medium; and, adding means for adding the bias signal to the modulated signal and outputting an added result to the magnetic recording/reproducing means.

5. A digital signal magnetic recording/reproducing apparatus according to claim 4, wherein the bias signal generating means generates, at a frequency of more than three times a maximum frequency of a recording signal band, a bias signal having a current value that maximizes a total S/N ratio of a S/N ratio in the band and a S/N ratio when the power of a distortion remaining in the band is assumed noise.

6. A digital signal magnetic recording/reproducing apparatus comprising:

encoding means for adding an error control code to an inputted digital signal by increasing the number of multi-value levels and converting it into two multi-value digital signals;

carrier generating means for generating a carrier;

modulating means for subjecting the multi-value digital signals to quadrature biphase modulation using the carrier to generate a modulated signal;

magnetic recording/reproducing means for recording the modulated signal on a magnetic recording medium and reproducing the recorded signal;

carrier reproducing means for reproducing the carrier from the reproduced signal from the magnetic recording/reproducing means;

demodulating means for demodulating the reproduced signal from the magnetic recording/reproducing means into reproduced multi-value digital signals by using the carrier reproduced by the carrier wave reproducing means; and decoding means for converting the reproduced multi-value digital signals into a reproduced digital signal and simultaneously performing error correction.

7. A digital signal magnetic recording/reproducing apparatus according to claim 6, wherein the encoding means comprises means for effecting convolutional coding in adding an error control code by increasing the number of multi-value levels; and the decoding means comprises means for effecting error control by the maximum likelihood decoding method in converting the reproduced multi-value digital signals into the reproduced digital signal.

8. A digital signal magnetic recording/reproducing apparatus according to claim 6, further comprising bias means for adding a bias signal to the modulated signal before recording.

9. A digital signal magnetic recording/reproducing apparatus according to claim 8, wherein the bias means comprises:

bias signal generating means for generating a bias signal which minimizes a non-linear distortion of the reproduced signal from the magnetic recording medium; and adding means for adding the bias signal to the modulated signal and outputting an added signal to the magnetic recording/reproducing means.

10. A digital signal magnetic recording/reproducing apparatus according to claim 9, wherein the bias signal generating means generates, at a frequency of more than three times a maximum frequency of a recording signal band, a bias signal having a current value that maximizes a total S/N ratio of a S/N ratio in the band and a S/N ratio when a power of a distortion remaining in the band is assumed noise.

11. A digital signal magnetic recording/reproducing apparatus comprising:

encoding means for adding an error control code to an inputted digital signal by increasing the number of multi-value levels and converting it into two multi-value digital signals;

carrier wave generating means for generating a carrier;

modulating means for subjecting the multi-value digital signals to quadrature biphase modulation using the carrier to generate a modulated signal;

magnetic recording/reproducing means for recording the modulated signal on a magnetic recording medium and reproducing the recorded signal;

carrier reproducing means for reproducing the carrier from the reproduced signal from the magnetic recording/reproducing means;

demodulating means for demodulating the reproduced signal from the magnetic recording/reproducing means into reproduced multi-value digital signals by using the carrier reproduced by the carrier reproducing means;

first decoding means for subjecting the reproduced multi-value digital signals from the demodulating means to maximum likelihood decoding into non-corrected reproduced digital signals, regarding the effect of the frequency characteristic of the magnetic recording medium on the modulated signal as a convolutional coding; and second decoding means for subjecting the noncorrected reproduced digital signal to error control and converting it into a reproduced digital signal.

12. A digital signal magnetic recording/reproducing apparatus according to claim 11, wherein the first decoding means comprises:

memorizing means for memorizing a plurality of signal sequences;

frequency characteristic memorizing and calculating means for memorizing the frequency characteristic of the magnetic recording medium, calculating amplitude values to be added to subsequent signal values due to effect of the plurality of signal sequences by using the frequency characteristic and the plurality of signal sequences memorized in the memorizing means, and calculating from the amplitude values assumed amplitude values when values next to the reproduced multi-value digital signals are assumed by all multi-value digital signal values producible by the encoding means;

branch metric calculating means for calculating distances between the assumed amplitude values and the amplitudes of the reproduced multi-value digital signals from the demodulating means; and adding, comparing and memorizing means for summing the distances from the branch metric calculating means to generate branch metric values of all the producible signal sequences successively to the plurality of signal sequences memorized in the memorizing means, comparing the branch metric values, controlling the memorizing means according to the result of comparison, outputting the most previously assumed signal value out of the most likely signal sequences from the memorizing means, and selecting a plurality of signal sequences which become candidates for next output signals to input them into the memorizing means.

13. A digital signal magnetic recording/reproducing apparatus according to claim 11, wherein the encoding means comprises means for effecting convolutional coding in adding an error control code by increasing the number of multi-value levels; and the decoding means comprises means for effecting error control by the maximum likelihood decoding method in converting the reproduced multi-value digital signals into the reproduced digital signal.

14. A digital signal magnetic recording/reproducing apparatus according to claim 11, further comprising bias means for adding a bias signal to the modulated signal before recording.

15. A digital signal magnetic recording/reproducing apparatus according to claim 14, wherein the bias means comprises:

bias signal generating means for generating a bias signal which minimizes a non-linear distortion of the reproduced signal from the magnetic recording medium; and adding means for adding the bias signal to the modulated signal and outputting an added signal to the magnetic recording/reproducing means.

16. A digital signal magnetic recording/reproducing apparatus according to claim 15, wherein the bias signal generating means generates, at a frequency of more than three times a maximum frequency of a recording signal band, a bias signal having a current value that maximizes a total S/N ratio of a S/N ratio in the band and a S/N ratio when a power of a distortion remaining in the band is assumed noise.

* * * * *